United States Patent

Chen et al.

(10) Patent No.: US 9,431,542 B2
(45) Date of Patent: Aug. 30, 2016

(54) SEMICONDUCTOR STRUCTURE

(71) Applicant: E Ink Holdings Inc., Hsinchu (TW)

(72) Inventors: Wei-Tsung Chen, Hsinchu (TW);
Chuang-Chuang Tsai, Hsinchu (TW);
Ted-Hong Shinn, Hsinchu (TW);
Xue-Hung Tsai, Hsinchu (TW);
Chih-Hsiang Yang, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 14/552,464

(22) Filed: Nov. 24, 2014

(65) Prior Publication Data

US 2015/0206950 A1     Jul. 23, 2015

(30) Foreign Application Priority Data

Jan. 17, 2014  (TW) .............................. 103101770 A

(51) Int. Cl.
*H01L 29/786* (2006.01)
*H01L 29/49* (2006.01)

(52) U.S. Cl.
CPC ..... *H01L 29/78648* (2013.01); *H01L 29/4908* (2013.01); *H01L 29/7869* (2013.01)

(58) Field of Classification Search
CPC ................................................. H01L 29/78693
See application file for complete search history.

(56) References Cited

U.S. PATENT DOCUMENTS

| 8,389,989 B2 | 3/2013 | Yamazaki et al. | |
| 2012/0049183 A1* | 3/2012 | Yamazaki | 257/43 |
| 2012/0211755 A1* | 8/2012 | Fujimori et al. | 257/59 |
| 2013/0320338 A1* | 12/2013 | Ono et al. | 257/43 |

FOREIGN PATENT DOCUMENTS

| TW | 201229269 | 7/2012 |
| TW | 201246554 | 11/2012 |

OTHER PUBLICATIONS

"Office Action of Taiwan Counterpart Application", issued on Mar. 24, 2016, p. 1-p.

* cited by examiner

*Primary Examiner* — Matthew Reames
*Assistant Examiner* — Steven B Gauthier
(74) *Attorney, Agent, or Firm* — Jianq Chyun IP Office

(57) ABSTRACT

A semiconductor structure includes a top gate, an oxide semiconductor channel layer, a first dielectric layer, a second dielectric layer, a source and a drain. The oxide semiconductor channel layer is disposed between the top gate and a substrate. The first dielectric layer is disposed between the top gate and the oxide semiconductor channel layer. The second dielectric layer is disposed between the first dielectric layer and the oxide semiconductor channel layer. The source and the drain are disposed on two opposite sides of the oxide semiconductor channel layer and located between the first dielectric layer and the substrate. A portion of the oxide semiconductor channel layer is exposed between the source and the drain. A portion of the first dielectric layer and a portion of the second dielectric layer directly contact with and entirely cover the portion of the oxide semiconductor channel layer.

11 Claims, 2 Drawing Sheets

SEMICONDUCTOR STRUCTURE

CROSS-REFERENCE TO RELATED APPLICATION

This application claims the priority benefit of Taiwan application Ser. No. 103101770, filed on Jan. 17, 2014. The entirety of the above-mentioned patent application is hereby incorporated by reference herein and made a part of this specification.

BACKGROUND OF THE INVENTION

1. Field of the Invention

The application relates to a semiconductor structure, and more particularly to a semiconductor structure having an oxide semiconductor channel layer.

2. Description of Related Art

Currently, the most ubiquitous type of liquid crystal display is mainly constructed with a thin film transistor array substrate, a color filter substrate and a liquid crystal layer sandwiched therebetween. On a conventional thin film transistor array substrate, amorphous silicon (a-Si) thin film transistor or low temperature polysilicon thin film transistor is typically used as a switching unit of each sub-pixel. In recent years, many studies have suggested that oxide semiconductor thin film transistor has higher field-effect mobility, and comparing with the low temperature polysilicon thin film transistor, the oxide semiconductor thin film transistor has better uniformity in the threshold voltage (Vth). Accordingly, the oxide semiconductor thin film transistor has the potential to become a critical device of the next generation flat display. However, under the framework of the conventional oxide semiconductor thin film transistor, it is difficult to further elevate the field-effect mobility.

SUMMARY OF THE INVENTION

The application provides a semiconductor structure having better field-effect mobility.

The application provides a semiconductor structure disposed on a substrate. The semiconductor structure includes a top gate, an oxide semiconductor channel layer, a first dielectric layer, a second dielectric layer, a source and a drain. The oxide semiconductor channel layer is disposed between the top gate and the substrate. The first dielectric layer is disposed between the top gate and the oxide semiconductor channel layer. The second dielectric layer is disposed between the first dielectric layer and the oxide semiconductor channel layer, wherein a dielectric constant of the first dielectric layer is different from a dielectric constant of the second dielectric layer. The source and the drain are disposed at two opposite sides of the oxide semiconductor channel layer, and located between the first dielectric layer and the substrate. A portion of the oxide semiconductor channel layer is exposed between the source and the drain. Portions of the first dielectric layer and the second dielectric layer are in direct contact with and completely cover the portion of the oxide semiconductor channel layer.

In one exemplary embodiment of the application, a material of the above oxide semiconductor channel layer includes indium-gallium-zinc oxide (IGZO), zinc oxide (ZnO), indium-zinc oxide (IZO) or indium-zinc-tin oxide (IZTO).

In one exemplary embodiment of the application, one of the above first dielectric layer and second dielectric layer is a silicon nitride layer (SiNx), while another one of the above first dielectric layer and second dielectric layer is a silicon oxide layer (SiOx).

In one exemplary embodiment of the application, the portion of the above oxide semiconductor channel layer is partitioned into a first portion and a second portion surrounding the first portion. The portion of the first dielectric layer is in direct contact with the first portion for the first portion to have a first electric conductivity. The portion of the second dielectric layer is in direction contact with the second portion for the second portion to have a second electric conductivity. The first electric conductivity is different from the second electric conductivity.

In one exemplary embodiment of the application, a ratio of the contact area between the above portion of the first dielectric layer and the first portion to the contact area between the above portion of the second dielectric layer and the second portion is between 1/10 to 10.

In one exemplary embodiment of the application, the above semiconductor structure further includes a protection layer and a transparent conductive layer. The protection layer is disposed on the substrate and covers the top gate and the first dielectric layer. The transparent conductive layer is disposed on the protection layer and covers the protection layer.

In one exemplary embodiment of the application, the above semiconductor structure further includes a bottom gate and a gate insulation layer. The bottom gate is disposed on the substrate and located between the oxide semiconductor channel layer and the substrate. The gate insulation layer is located between the oxide semiconductor channel layer and the bottom gate and covers the substrate and the bottom gate.

In one exemplary embodiment of the application, a thickness of the first dielectric layer is greater than that of the second dielectric layer.

In one exemplary embodiment of the application, the first dielectric layer covers the second dielectric layer and the oxide semiconductor channel layer.

In one exemplary embodiment of the application, the above second dielectric layer covers the source, the drain and the oxide semiconductor channel layer.

According to the above exemplary embodiments, the semiconductor structure of the application includes a first dielectric layer and a second dielectric layer having different dielectric constants, and the first dielectric layer and the second dielectric layer directly contact with and completely cover a portion of the oxide semiconductor channel layer that is exposed between the source and the drain. Accordingly, the total carrier density of the oxide semiconductor channel layer is elevated but current leakage resulted from complete conductivity is prevented. Hence, the semiconductor structure of the application has higher field-effect mobility.

Several exemplary embodiments accompanied with figures are described in detail below to further describe the invention in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the invention.

DESCRIPTION OF EMBODIMENTS

Figure 1:
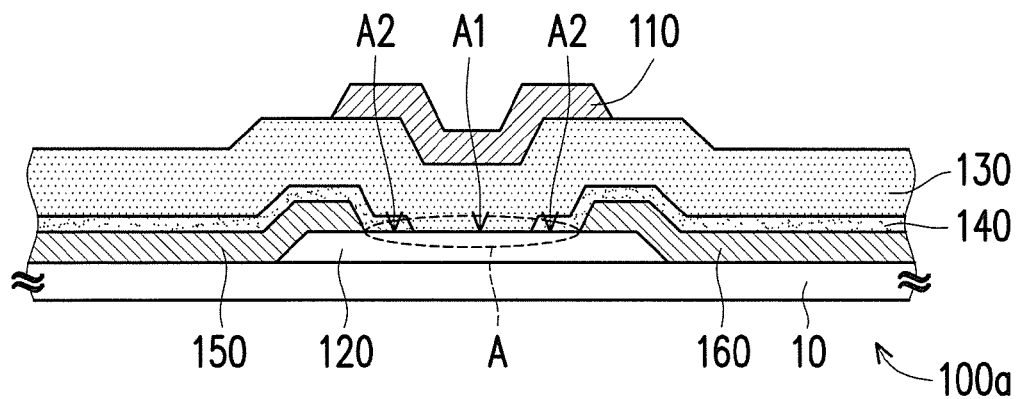
FIG. 1 is a schematic cross-sectional view of a semiconductor structure according to an embodiment of the application.

FIG. 1 is a schematic cross-sectional view of a semiconductor structure according to an embodiment of the application. Referring to FIG. 1, in the current exemplary embodiment, a semiconductor structure 100a is disposed on a substrate 10. The semiconductor structure 100a includes a top gate 110, an oxide semiconductor channel layer 120, a first dielectric layer 130, a second dielectric layer 140, and a source 150 and a drain 160. The oxide semiconductor channel layer 120 is disposed between the top gate 110 and the substrate 10. The first dielectric layer 130 is disposed between the top gate 110 and the oxide semiconductor channel layer 120, while the second dielectric layer 140 is disposed between the first dielectric layer 130 and the oxide semiconductor channel layer 120, wherein a dielectric constant of the first dielectric layer 130 is different from a dielectric constant of the second dielectric layer 140. The source 150 and the drain 160 are disposed at two corresponding sides of the oxide semiconductor channel layer 120 and located between the first dielectric layer 130 and the substrate 10. A portion A of the oxide semiconductor channel layer 120 is exposed between the source 150 and the drain 160. A portion of the first dielectric layer 130 and a portion of the second dielectric layer 140 directly contact with and completely cover the portion A of the oxide semiconductor channel layer 120.

More specifically, the substrate 10 may be, but not limited to, a glass substrate or a plastic substrate. The oxide semiconductor channel layer 120 is disposed on the substrate 10 and exposes a portion of the substrate 10, wherein a material of the oxide semiconductor channel layer 120 includes, but not limited to, indium-gallium-zinc oxide (IGZO), zinc oxide (ZnO), indium-zinc oxide (IZO) or indium-zinc-tin oxide (IZTO). The source 150 and the drain 160 are respectively disposed directly at a side of the surface of the oxide semiconductor channel layer 120, wherein the source 150 and the drain 160 are disposed parallel to each other. The portion A of the oxide semiconductor channel layer 120 is exposed between the source 150 and the drain 160, and the portion A of the oxide semiconductor channel layer 120 may be partitioned into a first portion A1 and a second portion A2 surrounding the first portion A1.

Specifically, the first dielectric layer 130 and the second dielectric layer 140 of the current exemplary embodiment have different dielectric constants. Alternatively speaking, the first dielectric layer 130 and the second dielectric layer 140 are formed with different dielectric materials. As shown in FIG. 1, the portion of the first dielectric layer 130 directly contacts with the first portion A1 for the first portion A1 to have a first electric conductivity, while the portion of the second dielectric layer 140 directly contacts the second portion A2 for the second portion A2 to have a second conductivity, wherein the first electric conductivity is different from the second electric conductivity. For example, when the first dielectric layer 130 is a silicon nitride layer (SiNx) while the second dielectric layer 140 is a silicon oxide layer (SiOx), the first portion A1 of the oxide semiconductor channel layer 120 is in direct contact with the first dielectric layer 130 to effectively elevate the electric conductivity of the first portion A1 to increase the carrier concentration and the field-effect mobility. On the other hand, the second portion A2 of the oxide semiconductor channel layer 120 is in direct contact with the second dielectric layer 140. The electric conductivity of the second portion A2 is lower than that of the first portion A1; hence, the second portion A2 of the oxide semiconductor channel layer 120 has a lower carrier concentration to prevent the oxide semiconductor channel layer 120, when being incapable of turning off, from the state of current leakage. Alternatively speaking, the design of the first dielectric layer 130 and the second dielectric layer 140 being in direct contact with and completely covering the first portion Al and the second portion A2 elevates the total carrier density of the oxide semiconductor channel layer 120 without creating a current leakage due a complete conductivity.

It is worth noting that in this exemplary embodiment, the first dielectric layer 130 is exemplified by a silicon nitride layer (SiNx), while the second dielectric layer 140 is exemplified by a silicon oxide layer (SiOx). However, it should be understood that the types of material used for the first dielectric layer 130 and the second dielectric layer 140 as disclosed above are provided for illustration purposes and not intended for limitation. In other exemplary embodiments, the second dielectric layer 140 may be a silicon nitride layer (SiNx), while the first dielectric layer 130 is a silicon oxide layer (SiOx). Alternatively speaking, providing that the materials used for the first dielectric layer and the second dielectric layer allows the oxide semiconductor channel layer 120 to generate two different electric conductivities, all modifications, alternatives, and equivalents of the disclosure fall within the spirit and scope of the application.

Referring to FIG. 1, in this exemplary embodiment, a ratio of the contact area between the portion of the first dielectric layer 130 and the first portion A1 to the contact area between the portion of the second dielectric layer 140 and the second portion A2 is between $1/10$ to 10, wherein a thickness of the first dielectric layer 130 is greater than a thickness of the second dielectric layer 140. Further, the first dielectric layer 130 covers the second dielectric layer 140 and the oxide semiconductor channel layer 120, while the second dielectric layer 140 covers the source 150, the drain 160 and the oxide semiconductor channel layer 120. The top gate 110 is disposed on and covers a portion of the first dielectric layer 130. Herein, the top gate 110 is constructed with a metal stacked layer or single metal layer, wherein the material of the top gate 110 may include metals with excellent conductivity, such as aluminum and copper. Depending on the actual design demands, the top gate 110 may be constructed with non-metal conductive materials. As shown in FIG. 1, the semiconductor structure 100a of this exemplary embodiment, constructed with the top gate 110, the oxide semiconductor channel layer 120, the first dielectric layer 130, the second dielectric layer 140, the source 150 and the drain 160, is a top gate thin film transistor (top gate TFT).

Since the semiconductor structure 100a of this exemplary embodiment includes the first dielectric layer 130 and the second dielectric layer 140 having different dielectric constants, and the first dielectric layer 130 directly contacts with the first portion Al of the oxide semiconductor channel layer 120, while the second dielectric layer 140 directly contacts with the second portion A2 of the oxide semiconductor channel layer 120. Accordingly, the first portion A1 and the second portion A2 of the oxide semiconductor channel layer 120 respectively comprise different electric conductivity, wherein the region (such as the first portion A1) having a higher electric conductivity has a higher carrier concentration to increase the field-effect mobility, while the region (such as the second portion A2) having a lower electric conductivity has a lower carrier concentration to impede the semiconductor structure 100a from a state of current leakage when semiconductor structure 100a is incapable of being turned off. Alternatively speaking, the configurations of the first dielectric layer 130, the second dielectric layer 140 and the oxide semiconductor channel layer 120 of the exemplary embodiments of the application can effectively increase the total carrier density of the oxide semiconductor channel layer 120 without creating a current leakage phenomenon due to a complete conductivity. Accordingly, the semiconductor structure 100a has higher field-effect mobility.

Reference will now be made to other exemplary embodiments of the application. Components that are the same as or similar to those of the previous embodiment are assigned with the same or similar reference numerals, and technical descriptions thereof will be omitted hereinafter.

Figure 2:
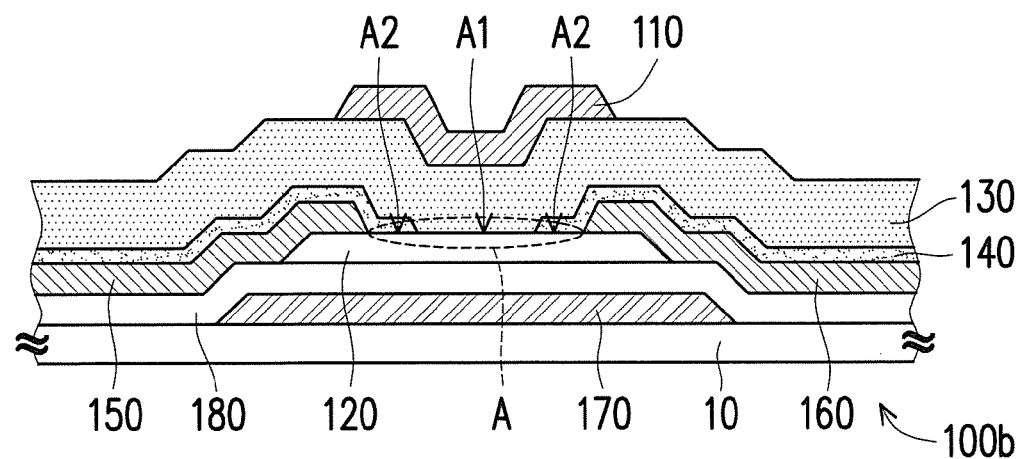
FIG. 2 is a schematic cross-sectional view of a semiconductor structure according to another embodiment of the application.

FIG. 2 is a schematic cross-sectional view of a semiconductor structure according to another embodiment of the application. Referring to FIG. 2, the semiconductor structure 100b of this exemplary embodiment is similar to the semiconductor structure 100a in FIG. 1. The difference between the two semiconductor structures lies in the semiconductor structure 100b further comprising a bottom gate 170 and a gate insulation layer 180. More specifically, the bottom gate 170 is directly disposed on the substrate 10 and located between the oxide semiconductor channel layer 120 and the substrate 10. The gate insulation layer 180 is located between the oxide semiconductor channel layer 120 and the bottom gate 170 and covers the substrate 10 and the bottom gate 170. As shown in FIG. 2, the semiconductor structure 100b constructed with the top gate 110, the oxide semiconductor channel layer 120, the first dielectric layer 130, the second dielectric layer 140, the source 150, the drain 160, the bottom gate 170 and the gate insulation layer 180 is a dual gate TFT.

Figure 3:
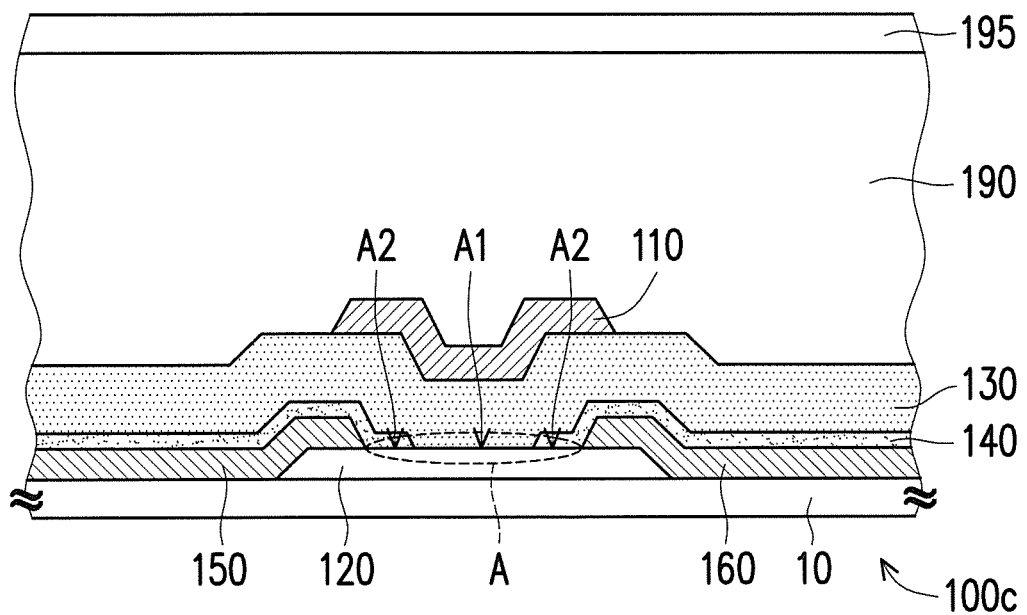
FIG. 3 is a schematic cross-sectional view of a semiconductor structure according to another embodiment of the application.

FIG. 3 is a schematic cross-sectional view of a semiconductor structure according to another embodiment of the application. Referring to FIG. 3, the semiconductor structure 100c of this exemplary embodiment is similar to the semiconductor structure 100a in FIG. 1. The difference between the two semiconductor structures lies in the semiconductor structure 100c further comprising a protection layer 190 and a transparent conductive layer 195. More specifically, the protection layer 190 is disposed on the substrate 10 and covers the top gate 110 and the first dielectric layer 130. The transparent conductive layer 195 is disposed on and covers the protection layer 190. Herein, the semiconductor structure 100c may be viewed as a pixel structure, and the top gate 110, the oxide semiconductor channel layer 120, the first dielectric layer 130, the second dielectric layer 140, the source 150 and the drain 160 constitute a top gate TFT.

Accordingly, the semiconductor structure of the application includes the first dielectric layer and the second dielectric layer having different dielectric constants, and the first dielectric layer and the second dielectric layer are respectively in direct contact with and completely cover the first portion and the second portion of the oxide semiconductor channel layer exposed between the source and the drain. Consequently, the first portion and the second portion of the oxide semiconductor channel layer respectively comprise different electric conductivity, wherein the region (such as the first portion) having a higher electric conductivity has a higher carrier concentration to increase the field-effect mobility of the semiconductor structure, while the region (such as the second portion) having a lower electric conductivity has a lower carrier concentration to prevent the semiconductor structure, when being unable to be turned off, from a state of current leakage. Alternatively speaking, the dispositions of the first dielectric layer, the second dielectric layer and the oxide semiconductor channel layer of the application can effectively elevate the total carrier density of the oxide semiconductor channel layer but circumvent the current leakage phenomenon due to complete conductivity. Accordingly, the semiconductor structure of the application has higher field-effect mobility.

It will be apparent to those skilled in the art that various modifications and variations can be made to the structure of the disclosed embodiments without departing from the scope or spirit of the invention. In view of the foregoing, it is intended that the disclosure cover modifications and variations of this specification provided they fall within the scope of the following claims and their equivalents.

What is claimed is:

1. A semiconductor structure, disposed on a substrate, the semiconductor structure comprising:
   a top gate;
   an oxide semiconductor channel layer, disposed between the top gate and the substrate;
   a first dielectric layer, disposed between the top gate and the oxide semiconductor channel layer;
   a second dielectric layer, disposed between the first dielectric layer and the oxide semiconductor channel layer, wherein a dielectric constant of the first dielectric layer is different from a dielectric constant of the second dielectric layer; and
   a source and a drain, disposed at two corresponding sides of the oxide semiconductor channel layer, and extending from the two corresponding sides of the oxide semiconductor channel layer to a surface of the substrate, and located between the first dielectric layer and the substrate, wherein a portion of the oxide semiconductor channel layer is exposed between the source and the drain, and a portion of the first dielectric layer and a portion the second dielectric layer directly contact with and completely cover the portion of the oxide semiconductor channel layer, and the second dielectric layer directly covers a top surface of the source and a top surface of the drain.

2. The semiconductor structure as recited in claim 1, wherein a material of the oxide semiconductor channel layer includes indium-gallium-zinc oxide (IGZO), zinc oxide (ZnO), indium-zinc oxide (IZO) or indium-zinc-tin oxide (IZTO).

3. The semiconductor structure as recited in claim 1, wherein one of the first dielectric layer and the second dielectric layer is a silicon nitride layer, while another one of the first dielectric layer and the second dielectric layer is a silicon oxide layer.

4. The semiconductor structure as recited in claim 1, wherein the portion of the oxide semiconductor channel layer is partitioned into a first portion and a second portion surrounding the first portion, the portion of the first dielectric layer is in direct contact with the first portion for the first portion to have a first electric conductivity, the portion of the second dielectric layer is in direct contact with the second portion for the second portion to have a second electric conductivity, and the first electric conductivity is different from the second electric conductivity.

5. The semiconductor structure as recited in claim 4, wherein a ratio of a contact area between the portion of the first dielectric layer and the first portion to a contact area between the portion of the second dielectric layer and the second portion is between 1/10 to 10.

6. The semiconductor structure as recited in claim 1 further comprising:
- a protection layer, disposed on the substrate and covers the top gate and the first dielectric layer; and
- a transparent conductive layer, disposed on the protection layer and covers the protection layer.

7. The semiconductor structure as recited in claim 1 further comprising:
- a bottom gate, disposed on the substrate and located between the oxide semiconductor channel layer and the substrate; and
- a gate insulation layer, located between the oxide semiconductor channel layer and the bottom gate and covers the substrate and the bottom gate.

8. The semiconductor structure as recited in claim 1, wherein a thickness of the first dielectric layer is greater than a thickness of the second dielectric layer.

9. The semiconductor structure as recited in claim 1, wherein the first dielectric layer covers the second dielectric layer and the oxide semiconductor channel layer.

10. The semiconductor structure as recited in claim 1, wherein the second dielectric layer covers the source, the drain and the oxide semiconductor channel layer.

11. The semiconductor structure as recited in claim 1, wherein the second dielectric layer is disposed between the first dielectric layer and the oxide semiconductor channel layer without covering the top gate.

* * * * *